(12) United States Patent
Srinivasan et al.

(10) Patent No.: US 8,962,421 B2
(45) Date of Patent: Feb. 24, 2015

(54) METHODS FOR FABRICATING INTEGRATED CIRCUITS INCLUDING SEMICONDUCTIVE RESISTOR STRUCTURES IN A FINFET ARCHITECTURE

(71) Applicant: GLOBALFOUNDRIES, Inc., Grand Cayman (KY)

(72) Inventors: Gopal Srinivasan, Castro Valley, CA (US); Andy Wei, Queensbury, NY (US); Dinesh Somasekhar, Portland, OR (US); Ali Keshavarzi, Los Altos, CA (US); Subi Kengeri, San Jose, CA (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 274 days.

(21) Appl. No.: 13/678,011

(22) Filed: Nov. 15, 2012

(65) Prior Publication Data

US 2014/0134822 A1    May 15, 2014

(51) Int. Cl.
| | |
|---|---|
| H01L 21/8234 | (2006.01) |
| H01L 21/20 | (2006.01) |
| H01L 49/02 | (2006.01) |
| H01L 27/088 | (2006.01) |
| H01L 29/78 | (2006.01) |
| H01L 29/66 | (2006.01) |
| H01L 29/786 | (2006.01) |
| H01L 21/8238 | (2006.01) |

(52) U.S. Cl.
CPC ........ *H01L 28/20* (2013.01); *H01L 21/823431* (2013.01); *H01L 27/0886* (2013.01); *H01L 29/785* (2013.01); *H01L 29/66795* (2013.01); *H01L 29/6681* (2013.01); *H01L 29/78648* (2013.01); *H01L 21/823821* (2013.01)
USPC ............................ 438/238; 438/382; 438/383

(58) Field of Classification Search
None
See application file for complete search history.

(56) References Cited

U.S. PATENT DOCUMENTS

| | | | | |
|---|---|---|---|---|
| 8,053,809 | B2 * | 11/2011 | Cheng et al. | 257/173 |
| 8,476,711 | B2 * | 7/2013 | Gossner et al. | 257/360 |
| 8,582,352 | B2 * | 11/2013 | Liaw | 365/154 |
| 8,796,772 | B2 * | 8/2014 | Yeh et al. | 257/350 |
| 8,816,436 | B2 * | 8/2014 | Cheng et al. | 257/350 |
| 2007/0284669 | A1 * | 12/2007 | Abadeer et al. | 257/368 |
| 2008/0277729 | A1 * | 11/2008 | Gossner et al. | 257/360 |
| 2011/0070712 | A1 * | 3/2011 | Johnson et al. | 438/382 |
| 2011/0163389 | A1 * | 7/2011 | Soss | 257/380 |
| 2013/0141963 | A1 * | 6/2013 | Liaw | 365/156 |
| 2013/0153993 | A1 * | 6/2013 | Chang et al. | 257/330 |
| 2013/0264679 | A1 * | 10/2013 | Kumar et al. | 257/529 |
| 2013/0307074 | A1 * | 11/2013 | Cheng et al. | 257/347 |

* cited by examiner

*Primary Examiner* — Charles Garber
*Assistant Examiner* — Ron Pompey
(74) *Attorney, Agent, or Firm* — Ingrassia Fisher & Lorenz, P.C.

(57) ABSTRACT

A method for fabricating a FinFET integrated circuit includes depositing a first polysilicon layer at a first end of a diffusion region and a second polysilicon layer at a second end of the diffusion region; diffusing an n-type material into the diffusion region to form a diffused resistor; and epitaxially growing a silicon material between the first and second polysilicon layers to form fins structures over the diffused resistor and spanning between the first and second polysilicon layers.

20 Claims, 9 Drawing Sheets

12
METHODS FOR FABRICATING INTEGRATED CIRCUITS INCLUDING SEMICONDUCTIVE RESISTOR STRUCTURES IN A FINFET ARCHITECTURE

TECHNICAL FIELD

Embodiments of the subject matter generally relate to semiconductor devices and methods for fabricating semiconductor devices, and more particularly, embodiments of the subject matter relate to methods for forming integrated circuits including semiconductive resistors on a semiconductor device.

BACKGROUND

Transistors, such as metal oxide semiconductor field-effect transistors (MOSFETs), are the core building block of the vast majority of semiconductor devices. Some semiconductor devices, such as high performance processor devices, can include millions of transistors. For such devices, decreasing transistors size, and thus increasing transistor density, has traditionally been a high priority in the semiconductor manufacturing industry.

Figure 1:
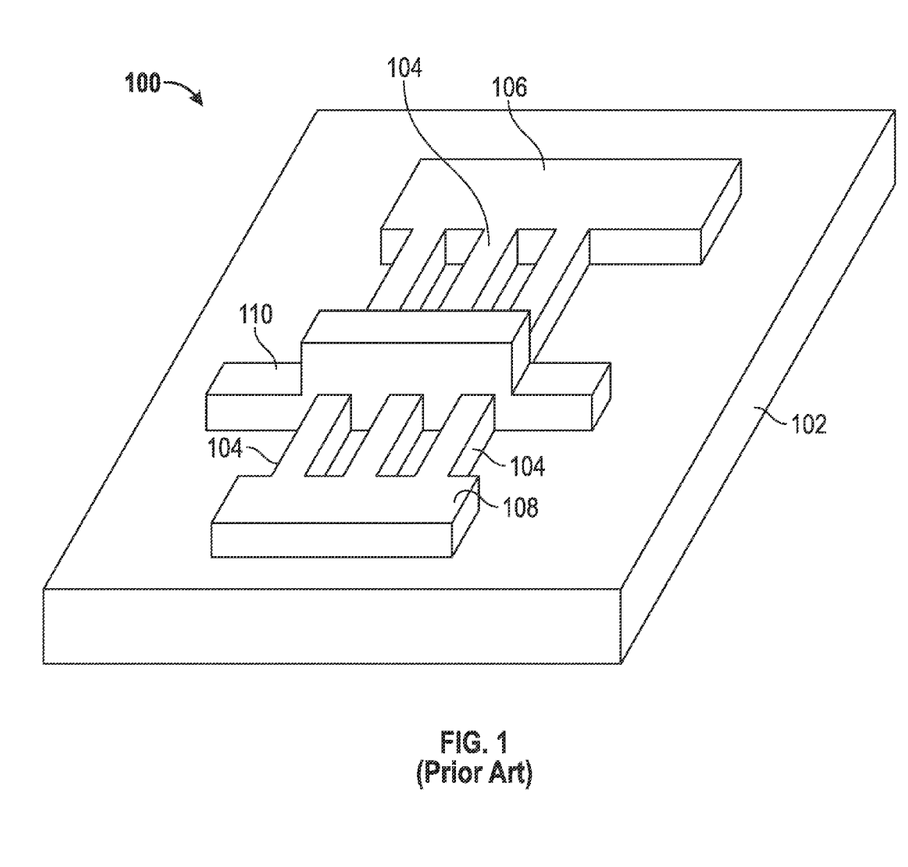
FIG. 1 is a simplified perspective view of a conventional FinFET having a plurality of fins.

A FinFET is a type of transistor that can be fabricated using very small scale processes. FIG. 1 is a simplified perspective view of a FinFET 100, which is formed on a semiconductor wafer substrate 102. A FinFET is named for its use of one or more conductive fins 104. As shown in FIG. 1, each fin 104 extends between a source region 106 and a drain region 108 of FinFET 100. FinFET 100 includes a gate structure 110 that is formed across fins 104. The surface area of the fins 104 in contact with gate structure 110 determines the effective channel of FinFET 100.

In addition to the fins, source, and drain regions, some FinFET architectures incorporate resistors. One type of resistor is known as a "diffused" resistor, wherein the resistive material is incorporated into the semiconductor substrate via molecular diffusion mechanisms. In process flows wherein the fin structures are grown epitaxially via epitaxial growth processes, it has been observed that if a diffused resistor is present in the region wherein epitaxial silicon is grown, then the growth occurs substantially uncontrollably, which can lead to large variability in the resistance of the device.

Accordingly, it is desirable to provide improved FinFET structures and methods for fabricating FinFET structures, which can allow for controllable epitaxial silicon growth in areas where a diffused resistor has been provided. Furthermore, other desirable features and characteristics of the present invention will become apparent from the subsequent detailed description of the invention and the appended claims, taken in conjunction with the accompanying drawings, the brief summary, and this background of the invention.

BRIEF SUMMARY

Methods for fabricating integrated circuits having FinFET structures and resistor structures are provided herein. In accordance with an exemplary embodiment, a method for fabricating a FinFET integrated circuit includes depositing a first polysilicon layer at a first end of a diffusion region and a second polysilicon layer at a second end of the diffusion region, diffusing an n-type material into the diffusion region to form a diffused resistor, and epitaxially growing a silicon material between the first and second polysilicon layers to form fins structures over the diffused resistor and spanning between the first and second polysilicon layers.

In another embodiment, a method for fabricating a FinFET integrated circuit includes forming a well structure within a semiconductor substrate, defining a diffusion region on the semiconductor substrate and over the well region, the defined diffusion region indicating an area wherein a diffused resistor is to be formed, and depositing a first polysilicon layer at a first end of a diffusion region and a second polysilicon layer at a second end of the diffusion region, wherein the first polysilicon region is deposited substantially parallel to and opposite of the second polysilicon region. The method further includes diffusing an n-type dopant material into the diffusion region to form a diffused resistor and epitaxially growing a silicon material between the first and second polysilicon layers to form a plurality of fins structures over the diffused resistor and spanning between the first and second polysilicon layers.

In yet another embodiment, a method for fabricating a FinFET integrated circuit includes forming a well structure within a semiconductor substrate, defining a diffusion region on the semiconductor substrate and over the well region, the defined diffusion region indicating an area wherein a diffused resistor is to be formed, and depositing a first polysilicon layer at a first end of a diffusion region and a second polysilicon layer at a second end of the diffusion region. The first polysilicon region is deposited substantially parallel to and opposite of the second polysilicon region. Further, the method includes diffusing an n-type dopant material into the diffusion region to form a diffused resistor, depositing a third polysilicon layer parallel to and between the first and second polysilicon layers, and over the diffusion region, and epitaxially growing a silicon material between the first and third polysilicon layers and between the second and third polysilicon layers to form a plurality of fins structures over the diffused resistor and spanning between the first and second polysilicon layers and between the second and third polysilicon layers.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

Various aspects of the disclosure will be more readily understood from the following detailed description taken in conjunction with the accompanying drawings that depict different embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor based integrated circuits are well known and so, in the interest of brevity, many conventional steps will only be mentioned briefly herein or will be omitted entirely without providing the well-known process details.

Techniques and technologies described herein may be utilized to fabricate MOS transistor devices, including NMOS transistor devices, PMOS transistor devices, and CMOS transistor devices. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

A variety of FinFET devices and related fabrication processes are known. It has proven very difficult to realize resistor structures (or other passive structures) when using traditional integrated fabrication techniques for FinFETs. Even if such structures are realized, they are susceptible to large variations in shape and size due to uncontrolled epitaxial silicon ("epi") growth. The fabrication methods disclosed herein provide an improved fabrication technique that allows for the manufacture of integrated circuits with resistors in a FinFET architectures. Further, the fabrication methods disclosed herein do not require any masking of the resistor structures during fabrication of the FinFET structures.

Figure 2A:
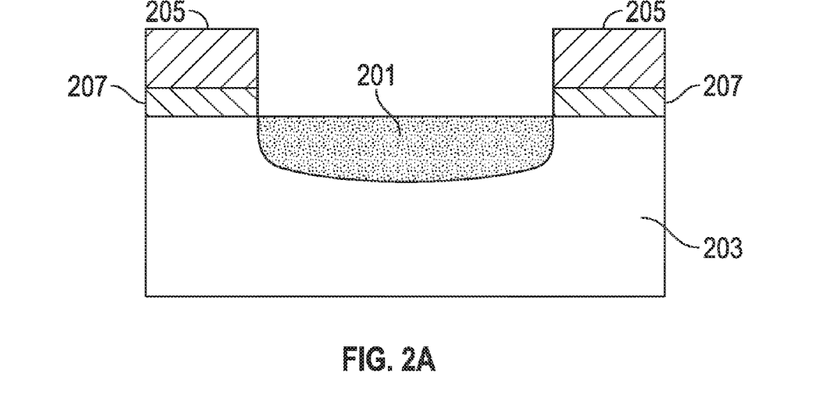
FIG. 2A is a cross-sectional view of a conventional diffused resistor.
Figure 2B:
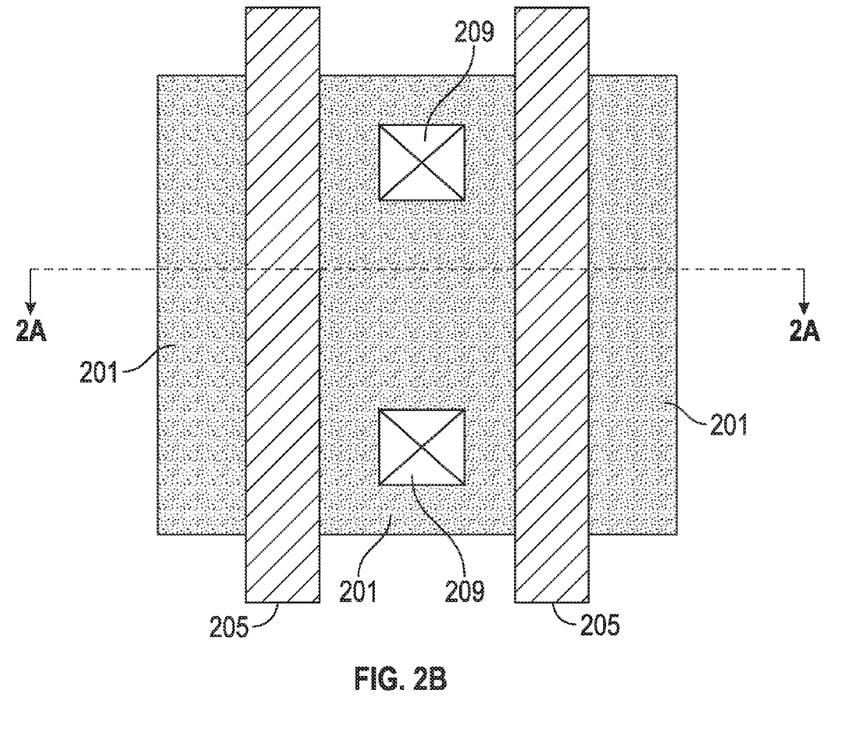
FIG. 2B is a top view of the conventional diffused resistor.

Embodiments of the present disclosure are suitable for use in fabricating FinFET structures incorporating one or more diffused resistors, also known as "diffusion resistors." A conventional diffusion resistor as is known in the art is described with regard to FIGS. 2A and 2B, and is provided to illustrate the basic physical properties of diffusion resistors in general. Typically, a central diffused region 201 is formed in a well-known manner by diffusion of an impurity of a particular conductivity type into a well 203 of opposite conductivity type contained within or supported on a substrate (not shown). The impurity can be either n-type or p-type; however in a typical p-well integrated circuit process, n-type diffusion is preferable since the resistor is placed in a p-well region, thus being effectively isolated from the remainder of the integrated circuitry. Additionally, n-type diffusion over a n-well is possible in accordance with the embodiments presented herein, provided isolation regions are implemented.

As shown in the cross-section of FIG. 2A, the diffused region 201 extends between a region defined by the lateral position of two polysilicon layers 205. The two polysilicon layers 205 are insulated from contacting the diffused region 201 by two insulating layers 207 (one for each of the two conductive layers 205), which are composed of an oxide insulating material, for example. As such, the polysilicon layers 205 define the boundaries of the resistor by the spacing therebetween, which is a tightly controlled dimension in typical MOS manufacturing processes. The portions of the diffused region 201 between the layers 205 are inhibited from carrying charges, and charge carriers are inhibited from passing under the polysilicon layers 205 by the presence of the insulating layers 207. As such, the boundaries of the resistor are therefore defined by the polysilicon layers 205. The width of the resistor can be the smallest allowed distance between two polysilicon lines, as defined for a particular manufacturing process.

As shown in FIG. 2B, current can be routed through the resistor 201 via conductive contacts 209, which are in contact with the diffused region at its upper surface. A defined metalization layer of the integrated circuit can form or connect with the contacts 209.

Turning now to an exemplary embodiment of the present invention, the diffusion resistor in a FinFET based process is prepared initially in a manner similar to that described above with regard to FIGS. 2A and 2B, that is, by diffusion of an impurity of a particular conductivity type into a well. Alternatively, ion implantation techniques may be employed to deposit the impurity into the well.

As noted initially above, in a FinFET based process, silicon is grown epitaxially over the diffusion region. FinFET process flows utilize epitaxial silicon growth technique to form the raw silicon material that forms the fins. The epitaxial growth may include silicon with germanium or carbon, or with impurities such as boron or phosphorous. The epitaxial layer may be grown by a CMOS compatible epitaxial process. The epitaxial process may include chemical vapor deposition (CVD) technique such as vapor-phase epitaxy (VPE), and/or other suitable processes known in the art. The epitaxial process may use gaseous (or liquid) precursors.

Figure 3:
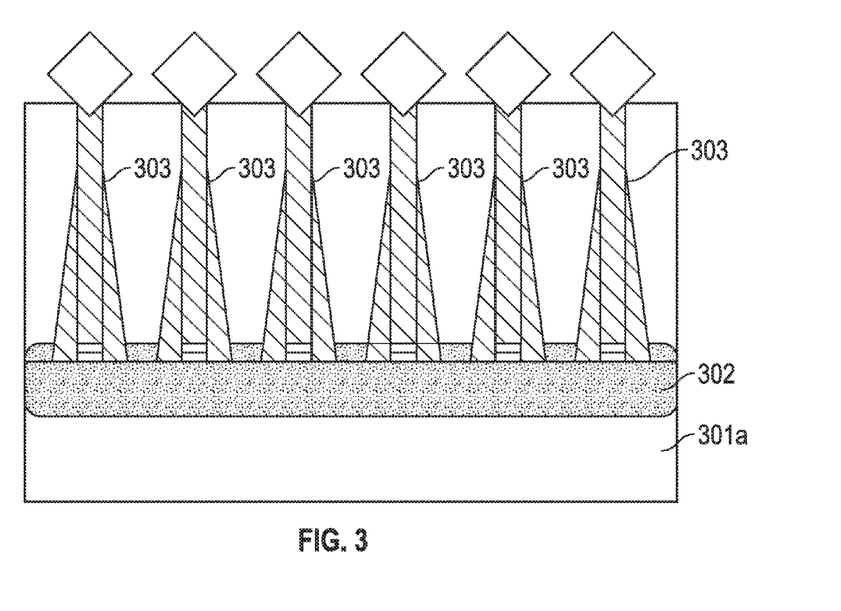
FIG. 3 is a cross-sectional view through the FIN structures of a diffused resistor in a FinFET based process illustrating epitaxial silicon growth over a diffusion layer in accordance with an exemplary embodiment of the present disclosure.

FIG. 3 illustrates the epitaxial growth of silicon (or silicon with conductivity-determining impurities) over a diffusion layer, such as an n+diffusion layer, in accordance with an exemplary embodiment. As is known in the art, a "diamond" or "square" shape is used to illustrate the epitaxial growth of silicon, and this convention is followed in FIG. 3 to illustrate the epitaxial growth of silicon to form the fin structures 303, as will be described in greater detail below. As shown therein, a layer of diffusion 302 is formed over a well 301a, 301b (such as a p-well, although an n-well is also possible). The epitaxial silicon growth process, described below, forms the fin structures 303. In embodiments where the well and diffusion types are the same, a shallow trench isolation feature would be provided, due to the need for electrical isolation encountered when employing an n-type diffused resistor over an n-type well.

However, it has been observed by the inventors herein that if just the diffusion layer 302 is present in the region wherein epitaxial silicon is grown, then the growth occurs substantially uncontrollably, which can lead to large variability in the resistance of the device. In contrast, the epitaxial silicon growth in the source/drain region of a FinFET, which can include, for example, polysilicon, is well-controlled. As such, it has been surprisingly discovered that it is preferable to employ an epitaxial growth technique based on the source/drain region of the FinFET in order to control the epitaxial silicon growth over the diffusion area. For example, epitaxial silicon can be grown from the source/drain region in a controlled manner to begin the formation of the fin. Thereafter, to continue growth of the fin laterally across the surface of the diffused region, epitaxial silicon can grow selectively on the sidewalls or the top of the initially formed fin, starting from the source/drains in a FinFET, in order to extend the fin to the full length and height desired between the source/drain regions. (FIG. 3 illustrates both growth on top of the fins as well as along the sides, with the width thereof being initially greater along the lower regions of the fins as epitaxial growth of silicon progresses).

It is well known that an important objective of any semiconductor fabrication process is to produce components having a particular critical dimension. The critical dimension of a feature, such as the polysilicon layers used in fabricating the source/drain regions of a MOSFET, is essentially the width of that feature. Because of the exacting nature of semiconductor devices, it is desirable to maintain the critical dimension (CD) of features within design tolerances. Numerous techniques have been developed for controlling the CDs of polysilicon features, and as such this tight control can be used advantageously when epitaxially growing silicon over a diffusion layer, as described above. By tightly controlling the width of spaced apart polysilicon features, the spacing therebetween can be tightly controlled. That is, growing epitaxial silicon to/from a polysilicon layer that has a tightly controlled CD reduces the variability in growth that is otherwise encountered when simply growing epitaxial silicon over a diffusion layer. This leads to lesser variability is the resistance of the resistor.

Figure 4:
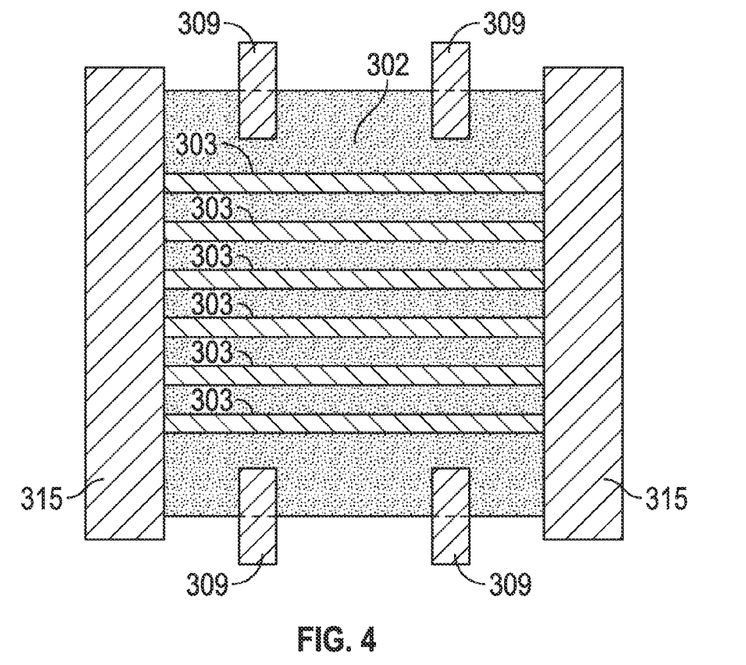
FIGS. 4-15 illustrate, in various exemplary embodiments, process architectures for controlling epitaxial silicon growth over a diffusion layer.

In this regard, reference is now made to FIG. 4, which depicts an exemplary process architecture for controlling epitaxial silicon growth over a diffusion layer by taking advantage of the tightly controlled polysilicon layer critical dimensions used to form source/drain regions of the FinFET. As shown therein, a layer of diffusion 302 is bounded on opposite sides by polysilicon layers 315, which are the source/drain regions. Again, layers 315 are fabricated with a tightly controlled CD. Thereafter, taking advantage of the controllable growth of epitaxial silicon described above, fins 303 are fabricated extending between polysilicon layers 315. In this regard, it is appreciated that silicon may be grown (with or without an atomic percentage of Ge or C, and/or a sub-atomic % of dopants such as B or P) selectively on the fin sidewalls or the top of the fins as the fins 303 are grown between the respective source and drain regions 315. Furthermore, to complete the resistor structure, contacts 309 are formed to the diffusion layer 302, using techniques well-known in the art.

The fabrication process to form the structure depicted in FIG. 4 will generally begin with a step of depositing a first polysilicon layer at a first end of a region wherein a diffused resistor is to be formed, hereinafter referred to as a "diffusion region." A second polysilicon layer is also formed at a second end of the diffusion region. Typically, the first and second polysilicon layers will be parallel to and opposite one another on either side of the diffusion region. Well-known polysilicion deposition, lithographic masking, and etching steps may be performed to form the first and second polysilicon layers. Again, the first and second polysilicon layers area tightly controlled critical dimension for the source/drain regions.

Thereafter, the fabrication process continues with a step of diffusing an n-type material into the diffusion region to form a diffused resistor. Without the presence of the polysilicon layers (i.e., if just the diffused resistor were present), growing epitaxial silicon over the diffused resistor would result in a substantially uncontrollable process, with large, undesirable variations in fin dimensions. However, according to the presently described fabrication process, a step of epitaxially growing a silicon material between the first and second polysilicon layers to form fins structures over the diffused resistor and spanning between the first and second polysilicon layers allows for the epitaxial silicon growth to occur controllably.

Figure 5:
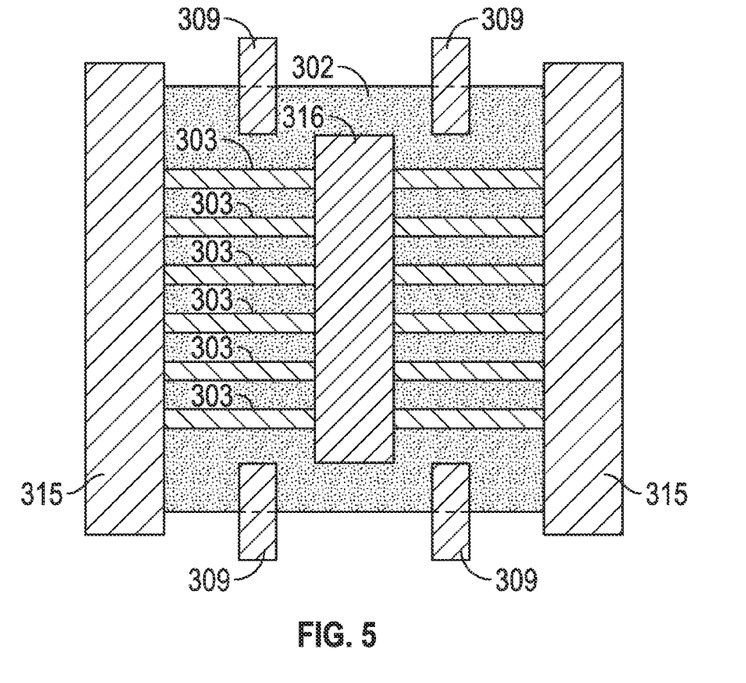

In addition to the embodiment described above with regard to FIG. 4, numerous other embodiments of a resistor structure, suitable for fabrication in a FinFET architecture, are possible using the described fabrication process, and are set forth in detail in FIGS. 5-15. In FIG. 5, an embodiment is shown wherein an additional "dummy" layer of polysilicon 316 is included between the layers 315 (and would be formed after formation of the diffused resistor, as described above, using conventional deposition, masking, and etching techniques). The layer 316 further aides in controlling the growth of epitaxial silicon, as the distance between respective polysilicon layers (all of which having tightly controlled CDs) is reduced by half as compared to the embodiment of FIG. 5.

Figure 6:
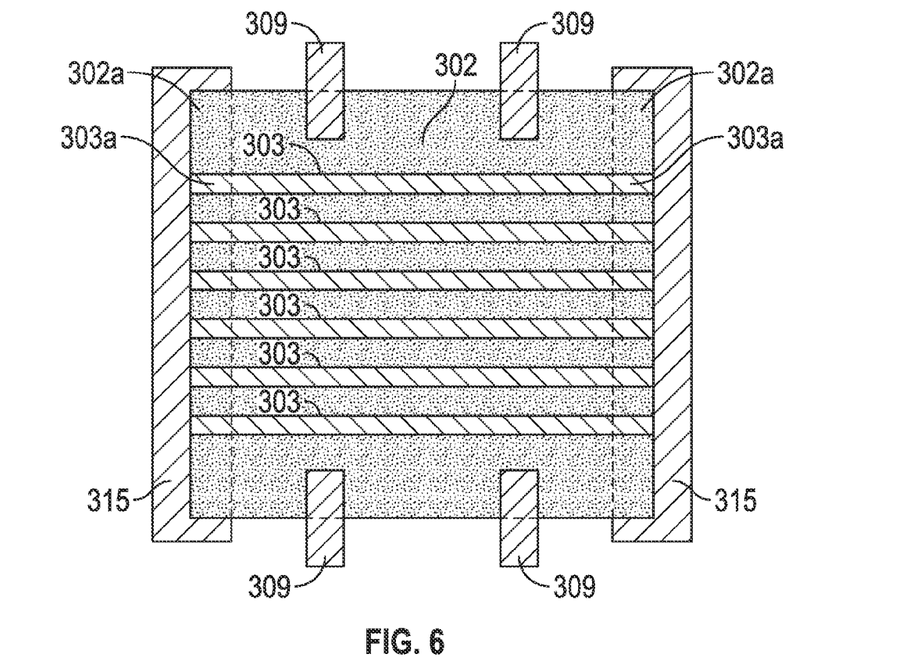
Figure 7:
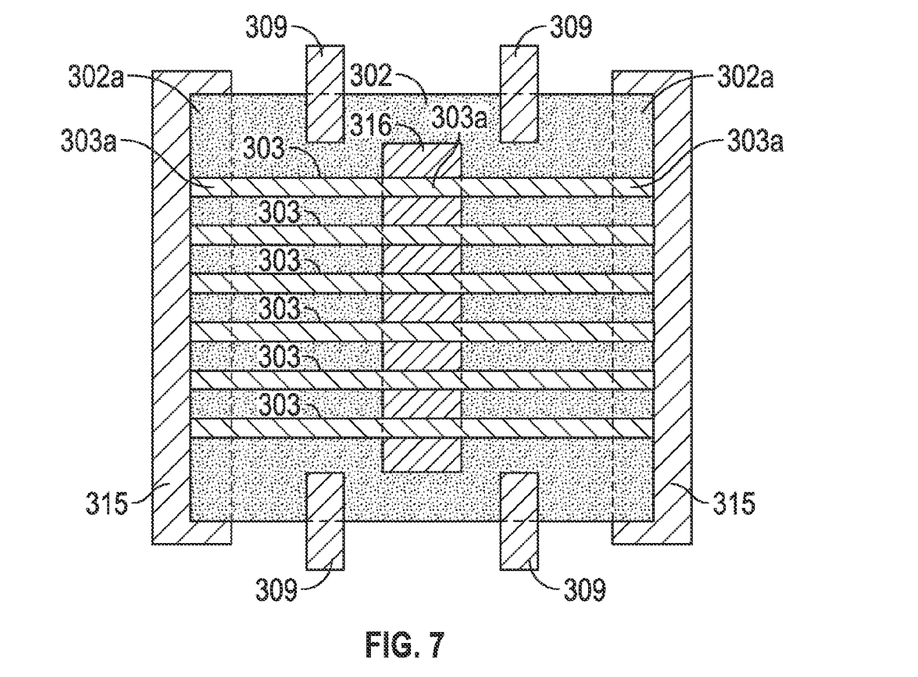
Figure 8:
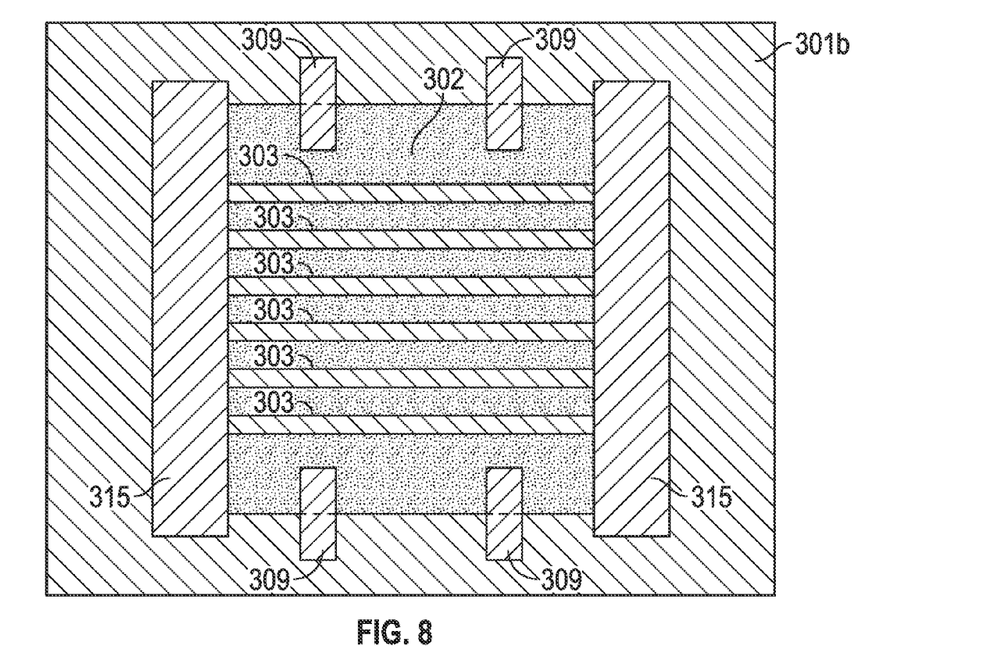
Figure 9:
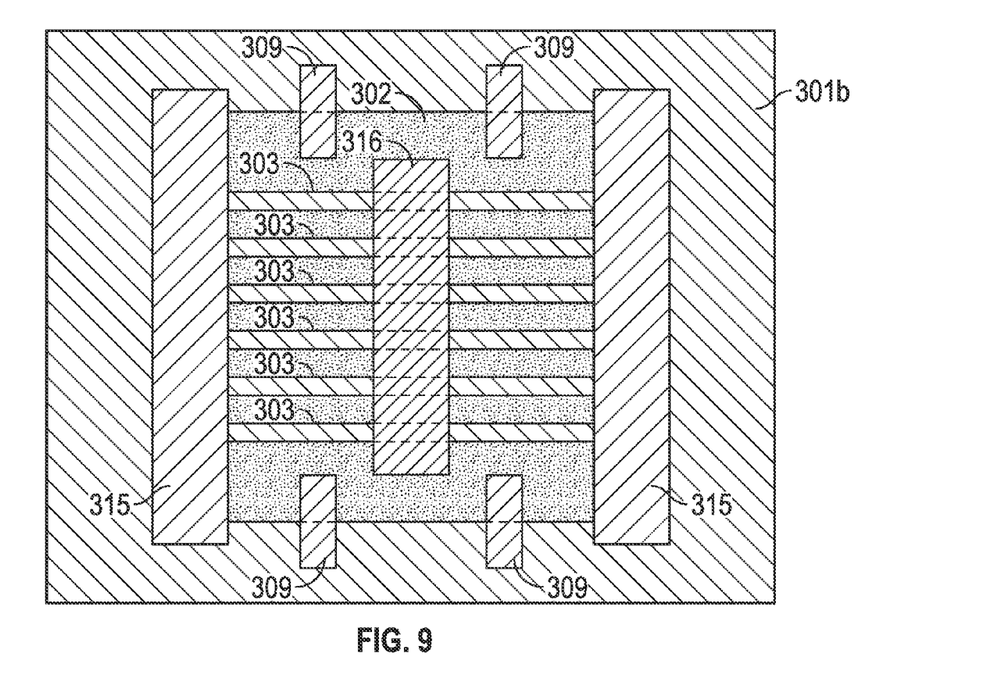
Figure 10:
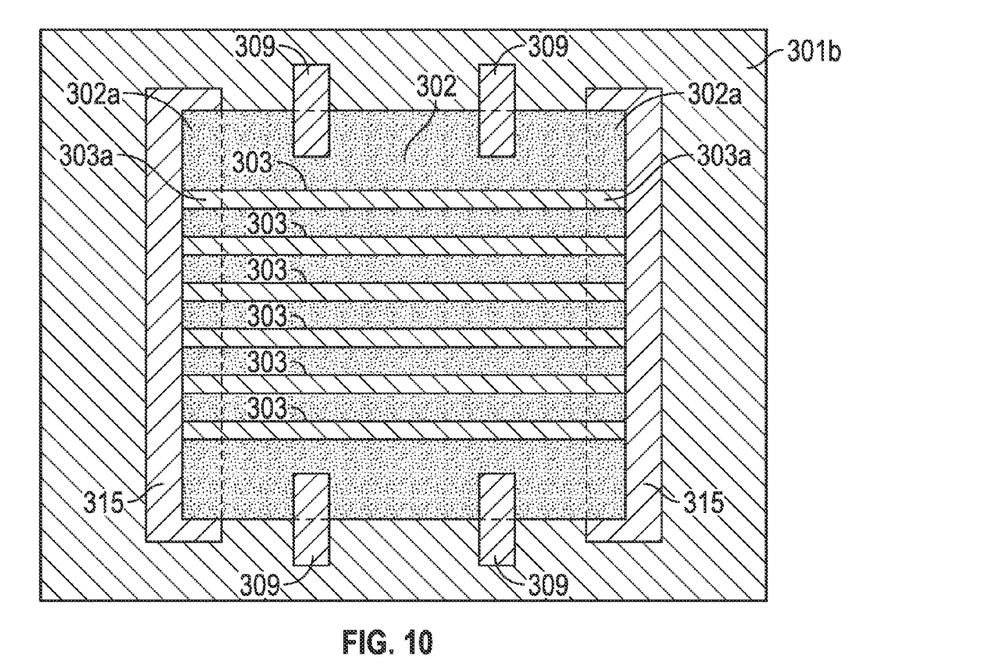
Figure 11:
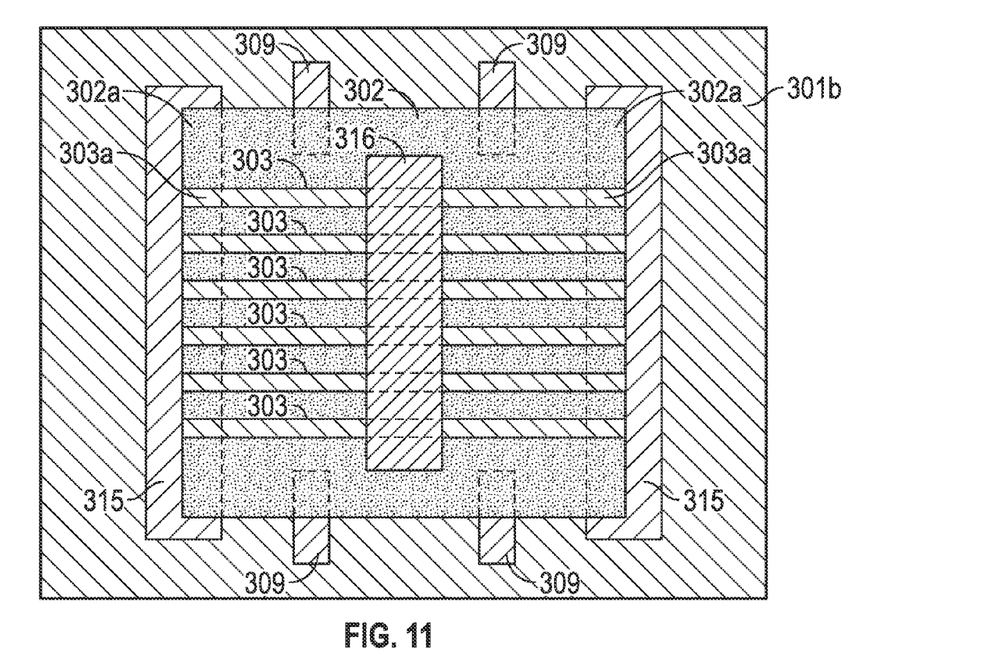

In further embodiments, as shown in FIGS. 6 and 7, it will be appreciated that it is not strictly necessary that the diffusion layer 302 and the fins 303 be formed to span exactly between the boundaries of the polysilicon layers 315 (and optionally 316) in order to take advantage of the controlled growth of epitaxial silicon thereon. In particular, as shown in FIGS. 6 and 7, it is possible to fabricate a resistor in accordance with the present disclosure that includes fin and/or diffusion layer "tucking," that is, a portion the fins 303 and/or the diffusion layer 302 is fabricated within the area covered by the layers 315 and/or 316. For example, as shown with regard to the diffusion layer 302 and the fins 303 in FIGS. 6 and 7, there is a "tucked" area of the diffusion layer 302a and a "tucked" area of each fin 303a.

The previous embodiments shown with regard to FIGS. 4-7 have been presented in the context of the typical case of an n-type diffusion material disposed over a p-type well. However, in alternate embodiments, it is possible to design a resistor structure in accordance with the present disclosure that includes an n-type diffusion material disposed over an n-type well. FIGS. 8-15 depict such embodiments. More particularly, with regard to FIGS. 8-11, the resistor structure is similar as described above with regard to FIGS. 4-7, respectively, with the exception that an n-well 301b is depicted beneath the diffusion layer 302. As noted above, in some embodiments, it may be desirable to include a shallow trench isolation feature (not shown in FIGS. 8-11) between the fins 303 to provide appropriate electrical isolation within the resistor structure.

Figure 12:
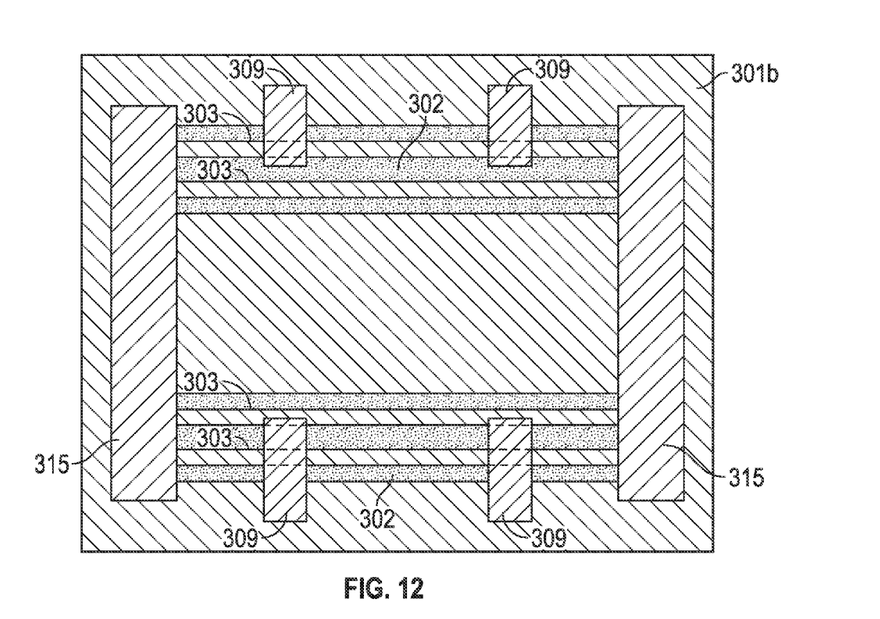
Figure 13:
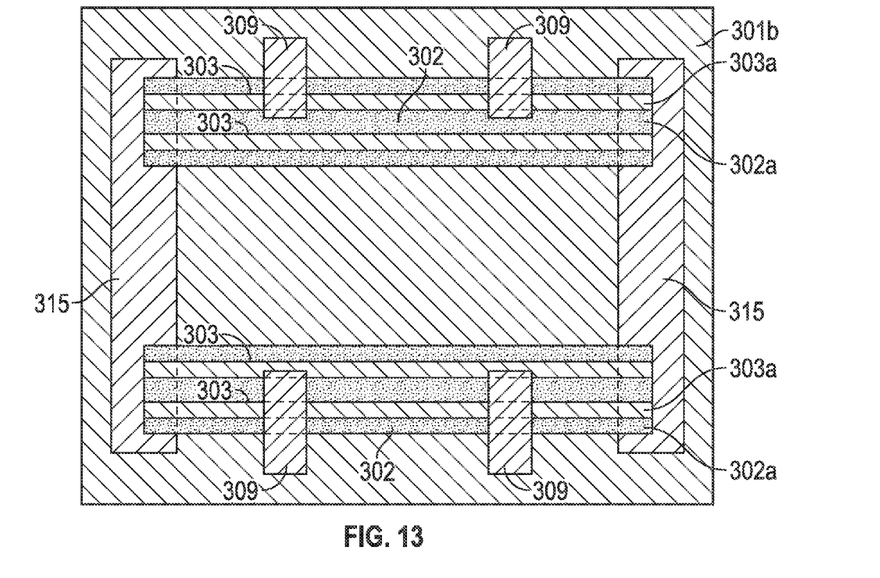
Figure 14:
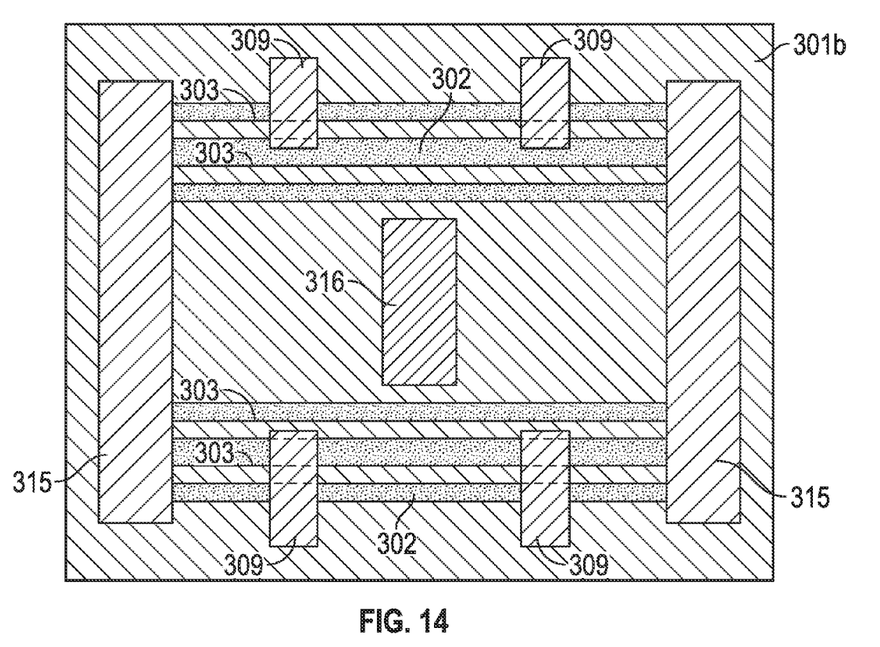
Figure 15:
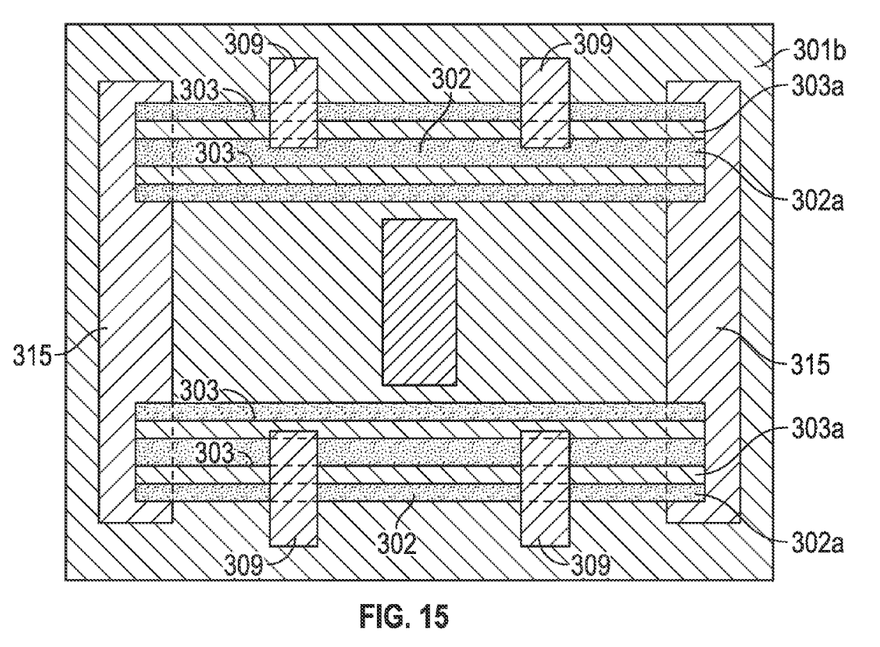

FIGS. 12-15 depict further alternate configurations as may be suitable for use where an n-well is provided. FIG. 12 depicts separated diffusion layers 302, with a region therein between with no diffusion material provided. An STI feature may be provided therein. In this embodiment, the contacts 309 may be provided directly over the fins 303 to make contact with the diffusion layer 302. FIG. 13 depicts a similar embodiment, but with "tucked" diffusion areas 302a and fins 303a. FIGS. 14 and 15 are similar to FIGS. 12 and 13, respectively, but with the inclusion of a "dummy" polysilicon layer 316 in the region wherein no diffusion material is provided.

As such, provided herein are various diffused resistor structures that are suitable for fabrication in FinFET process flows. In the embodiments described herein, an epitaxial growth technique based on the source/drain region of the FinFET is employed in order to control the epitaxial silicon growth over the diffusion area. For example, epitaxial silicon can be grown selectively on the fin sidewalls or the top interface of a recessed fin, starting from the source/drains in a FinFET. In this manner, the uncontrollable growth of epitaxial silicon over the diffusion layer previously encountered in the art is avoided. Further, the use of separate masking process steps to mask some or all of the diffusion region in fabricating the fins is avoided.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for fabricating a FinFET integrated circuit, comprising:
    depositing a first polysilicon layer at a first end of a diffusion region and a second polysilicon layer at a second end of the diffusion region;
    diffusing dopant material into the diffusion region to form a diffused resistor; and
    epitaxially growing a silicon material between the first and second polysilicon layers to form fins structures over the diffused resistor and spanning between the first and second polysilicon layers.

2. The method of claim 1, wherein diffusing the dopant material into the semiconductor substrate comprises diffusing an n-type material into a p-type well formed in the semiconductor substrate.

3. The method of claim 1, wherein diffusing the dopant material into the semiconductor substrate comprises diffusing an n-type material into an n-type well formed in the semiconductor substrate.

4. The method of claim 3, further comprising forming a shallow trench isolation feature in the diffusion region.

5. The method of claim 3, wherein forming the diffusion region comprises forming a first and second diffusion sub-region, the first and second diffusion sub-regions being separated by a region wherein no n-type material is diffused.

6. The method of claim 1, wherein depositing the first and second polysilicon layers comprises depositing the first and second polysilicon layers adjacent to the first and second ends of the diffusion region.

7. The method of claim 1, wherein depositing the first and second polysilicon layers comprises depositing the first and second polysilicon layers overlapping the first and second ends of the diffusion region.

8. The method of claim 1, wherein epitaxially growing the silicon material comprises expitaxially growing a silicon material with an atomic percentage of Ge or C.

9. The method of claim 1, wherein epitaxially growing the silicon material comprises expitaxially growing a silicon material with a sub-atomic percentage of B or P.

10. The method of claim 1, further comprising forming a dummy polysilicon layer over the diffusion region and between the first and second polysilicon layers.

11. The method of claim 1, further comprising forming a contact to the diffusion region.

12. A method for fabricating a FinFET integrated circuit, comprising:
    forming a well structure within a semiconductor substrate;
    defining a diffusion region on the semiconductor substrate and over the well region, the defined diffusion region indicating an area wherein a diffused resistor is to be formed;
    depositing a first polysilicon layer at a first end of a diffusion region and a second polysilicon layer at a second end of the diffusion region, wherein the first polysilicon region is deposited substantially parallel to and opposite of the second polysilicon region;
    diffusing an n-type dopant material into the diffusion region to form a diffused resistor; and
    epitaxially growing a silicon material between the first and second polysilicon layers to form a plurality of fins structures over the diffused resistor and spanning between the first and second polysilicon layers.

13. The method of claim 12, wherein forming the well structure comprises forming a p-type well structure.

14. The method of claim 12, wherein forming the well structure comprises forming an n-type well structure.

15. The method of claim 14, further comprising forming a shallow trench isolation feature in the diffusion region.

16. The method of claim 12, wherein epitaxially growing the silicon material comprises expitaxially growing a silicon material with an atomic percentage of Ge or C.

17. The method of claim 12, wherein epitaxially growing the silicon material comprises expitaxially growing a silicon material with a sub-atomic percentage of B or P.

18. The method of claim 1, further comprising forming a contact to the diffusion region.

19. A method for fabricating a FinFET integrated circuit, comprising:
    forming a well structure within a semiconductor substrate;
    defining a diffusion region on the semiconductor substrate and over the well region, the defined diffusion region indicating an area wherein a diffused resistor is to be formed;
    depositing a first polysilicon layer at a first end of a diffusion region and a second polysilicon layer at a second end of the diffusion region, wherein the first polysilicon region is deposited substantially parallel to and opposite of the second polysilicon region;
    diffusing an n-type dopant material into the diffusion region to form a diffused resistor;
    depositing a third polysilicon layer parallel to and between the first and second polysilicon layers, and over the diffusion region; and
    epitaxially growing a silicon material between the first and third polysilicon layers and between the second and third polysilicon layers to form a plurality of fins structures over the diffused resistor and spanning between the first and second polysilicon layers and between the second and third polysilicon layers.

20. The method of claim 19, further comprising forming a contact to the diffusion region.

* * * * *